United States Patent
Nakai

(10) Patent No.: US 6,753,557 B2
(45) Date of Patent: Jun. 22, 2004

(54) SEMICONDUCTOR DEVICE HAVING A CONDENSER LENS FOR USE IN LIGHT RECEIVING DEVICE OR LIGHT EMITTING DEVICE

(75) Inventor: Junichi Nakai, Fukuyama (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/354,279

(22) Filed: Jan. 30, 2003

(65) Prior Publication Data

US 2003/0173599 A1 Sep. 18, 2003

(30) Foreign Application Priority Data

Jan. 31, 2002 (JP) ........................................ 2002-023772

(51) Int. Cl.[7] ..................... H01L 29/76; H01L 31/0232; H01L 31/0203; H01L 33/00
(52) U.S. Cl. ..................... 257/233; 257/232; 257/432; 257/434; 257/436; 257/80; 257/98
(58) Field of Search ............................... 257/232, 233, 257/432, 434, 436, 80, 98

(56) References Cited

U.S. PATENT DOCUMENTS 5,371,397 A * 12/1994 Maegawa et al. ........... 257/432
5,691,548 A * 11/1997 Akio ........................... 257/232
5,739,548 A * 4/1998 Shigeta et al. ................ 257/59
6,586,811 B2 * 7/2003 Sekine ......................... 257/432

FOREIGN PATENT DOCUMENTS

JP           4-12568        1/1992
JP          11-40787        2/1999

* cited by examiner

*Primary Examiner*—Ngân V. Ngô
(74) *Attorney, Agent, or Firm*—David G. Conlin; George W. Neuner; Edwards & Angell, LLP

(57) ABSTRACT

A semiconductor device comprising: a semiconductor substrate having a light receiving or emitting element; a condenser lens provided above the element; a first transparent film provided on the condenser lens for planarization over the condenser lens; a light-transmittable optical element provided above the first transparent film; and a second transparent film interposed between the first transparent film and the optical element; wherein the first transparent film is comprised of a fluorine compound so that the first transparent film is lower in refractive index than the condenser lens and the second transparent film is lower in water- and oil-repellent properties than the first transparent film.

10 Claims, 4 Drawing Sheets

SEMICONDUCTOR DEVICE HAVING A CONDENSER LENS FOR USE IN LIGHT RECEIVING DEVICE OR LIGHT EMITTING DEVICE

CROSS-REFERENCE TO RELATED APPLICATIONS

This application is related to Japanese application No. 2002-023772 filed on Jan. 31, 2002, whose priority is claimed under 35 USC § 119, the disclosure of which is incorporated by reference in its entirety.

BACKGROUND OF THE INVENTION

1. Field of the Invention

The present invention relates to a semiconductor device and a fabrication method therefor. More specifically, the invention relates to a semiconductor device having a condenser lens for use in a solid image-pickup device such as a CCD (charge coupled device), a liquid crystal display device and the like, and to a fabrication method therefor.

2. Description of the Related Art

Solid image-pickup devices such as CCDs and MOS (metal oxide semiconductor) image-pickup devices are employed for various applications, e.g., digital cameras, video cameras, cellular phones having cameras, scanners, digital copying machines and facsimile machines. As these products come into widespread use, demands for higher functions (increase in pixel number and improvement of photosensitivity), size reduction and cost reduction of the solid image-pickup device are correspondingly increased. For the size reduction and pixel number increase of the solid image-pickup device, the size of each pixel incorporated in the solid image-pickup device is further reduced. As a result, the photosensitivity of the solid image-pickup device (which is one of fundamental performance requirements) is reduced, making it difficult to pick up a clear image under a predetermined illuminance.

A known approach to this problem is to provide a micro-lens of an organic polymeric material on a color filter for improvement of the photosensitivity (see, for example, Japanese Unexamined Patent Publication No. HEI4-12568 (1992)). Another approach is to employ a condenser lens (so-called intra-layer lens) provided in a laminate structure between a light receiving portion and a color filter in combination with the aforesaid micro-lens for improvement of the photosensitivity (see, for example, Japanese Unexamined Patent Publication No. HEI11-40787 (1999)).

A fabrication method for a conventional CCD solid image-pickup device having an intra-layer lens will hereinafter be described with reference to FIGS. 2(a) to 2(e). A unit cell of the conventional CCD solid image-pickup device fabricated by the fabrication method shown in FIGS. 2(a) to 2(e) is illustrated in section in FIG. 1.

As shown in FIG. 2(a), a light receiving portion 2, a reading gate portion 3, CCD transfer channels (transfer portions) 4 and a channel stopper 5 are formed in a semiconductor substrate 1 by implanting desired impurity ions into the semiconductor substrate 1. In turn, transfer electrodes 7 having a predetermined pattern are formed on the surface of the semiconductor substrate 1 with the intervention of an insulating film 6, and a light shielding film 9 is formed as covering the transfer electrodes 7 with the intervention of an inter-level insulating film 8. Then, the light shielding film 9 is patterned so that an opening is formed therein above the light receiving portion 2.

As shown in FIG. 2(b), an overcoat layer 10 is formed on the light shielding film 9 for planarization of the surface. The overcoat layer 10 is, for example, a BPSG (boro-phospho silicate glass) film formed by a reflow process.

As shown in FIG. 2(c), an intra-layer lens material layer 16 having a high refractive index for formation of an intra-layer lens 11 (see FIG. 1) is formed on the overcoat layer 10. The intra-layer lens material layer 16 is, for example, a silicon nitride film formed by a plasma CVD process.

As shown in FIG. 2(d), a resist 17 is applied on the intra-layer lens material layer 16, then patterned, and re-flowed at about 160° C. so as to be formed into a lens shape.

As shown in FIG. 2(e), the intra-lens material layer 16 is dry-etched to be shaped into the intra-layer lens 11 by copying the lens shape of the resist 17 to the lens material layer 16.

Thereafter, a transparent film 12 having a low refractive index is formed over the intra-layer lens 11 and planarized for increasing the light convergence ratio of the intra-layer lens 11. Then, a color filter 13, a protective film 14 and a micro-lens 15 are sequentially formed on the transparent film 12. Thus, the CCD solid image-pickup device 18 shown in FIG. 1 is provided.

However, the aforesaid conventional fabrication method, in which the transparent film having a low refractive index is formed on the intra-layer lens and the color filter is directly formed on the transparent film, has the following drawbacks. In order to allow the intra-layer lens to provide a desired lens effect, an organic polymeric material generally employed as a material for the transparent film is required to have a low refractive index.

A known method for reducing the refractive index of the transparent film is to employ an organic polymeric material containing a greater amount of fluorine (see, for example, Polymer Vol. 34, March 1995). However, such a fluorine-containing material is highly water-repellent and oil-repellent and, hence, has poor adhesion to other materials. Where a dye-absorptive resist (e.g., casein or gelatin), a color resist or a resist for micro-lens formation is applied on the surface of the transparent film of the fluorine-containing material, for example, the resulting color resist layer or micro-lens layer is liable to have an uneven geometry because even application of the resist is difficult.

More specifically, there is a possibility that the color filter 13 formed by the aforesaid conventional method has an uneven thickness and is separated from the transparent film. Particularly in the case of the solid image-pickup device, this results in a poorer image quality and deterioration in product yield and product quality.

A conceivable method for improvement of the adhesion of the transparent film to the other materials is to perform an oxygen plasma treatment on the surface of the transparent film in an oxygen-containing atmosphere. However, the oxygen plasma treatment alone is insufficient for the improvement of the adhesion.

SUMMARY OF THE INVENTION

In view of the foregoing, the present invention is directed to a semiconductor device and a fabrication method therefor which ensure improved adhesion between a transparent film and an optical element such as a color filter or a micro-lens provided on the transparent film and are free from deterioration in product yield and product quality.

According to the present invention, there is provided a semiconductor device comprising: a semiconductor substrate having a light receiving or emitting element; a condenser lens provided above the element; a first transparent film provided on the condenser lens for planarization over the condenser lens; a light-transmittable optical element provided above the first transparent film; and a second transparent film interposed between the first transparent film and the optical element; wherein the first transparent film is comprised of a fluorine compound so that the first transparent film is lower in refractive index than the condenser lens and the second transparent film is lower in water- and oil-repellent properties than the first transparent film.

Since the second transparent film having the lower water- and oil-repellent properties than that of the first transparent film is interposed between the first transparent film and the optical element in the inventive semiconductor device, the optical element can be combined with the first transparent film with improved adhesion.

DESCRIPTION OF THE PREFERRED EMBODIMENTS

Figure 1:
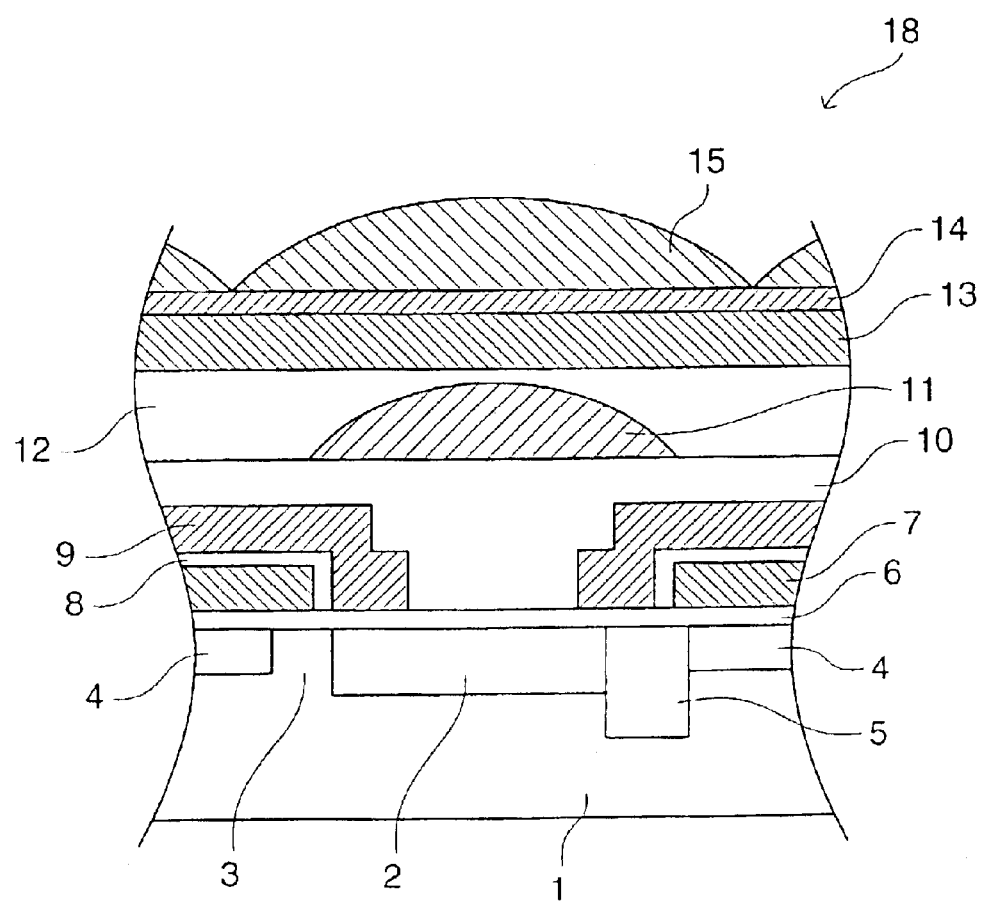
FIG. 1 is a schematic sectional view illustrating each pixel of a conventional solid image-pickup device.
Figure 2A:
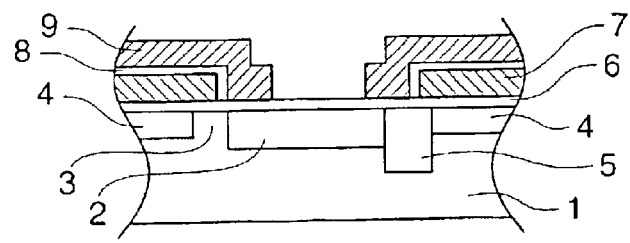
FIGS. 2(a) to 2(e) are process diagrams illustrating a production process for the conventional solid image-pickup device.
Figure 2B:
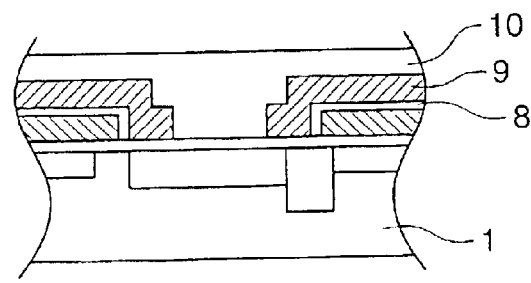
Figure 2C:
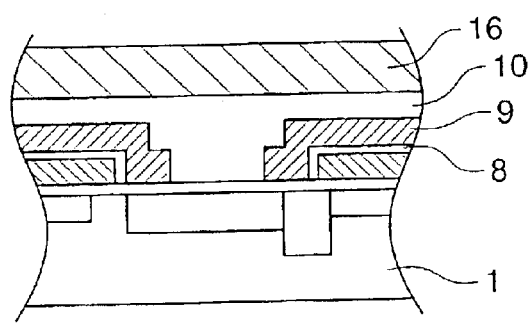
Figure 2D:
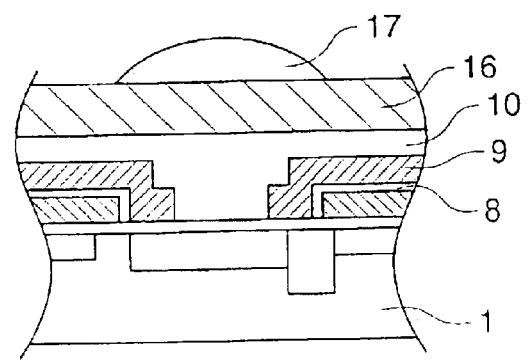
Figure 2E:
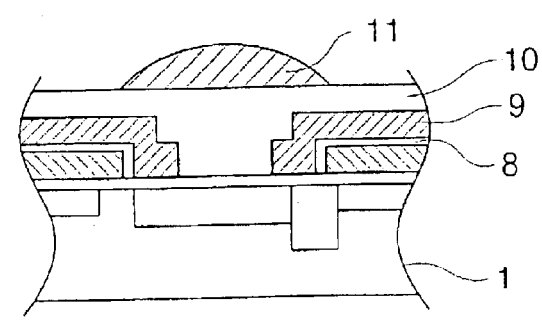

A semiconductor device according to the present invention comprises: a semiconductor substrate having a light receiving or emitting element; a condenser lens provided above the element; a first transparent film provided on the condenser lens for planarization over the condenser lens; a light-transmittable optical element provided above the first transparent film; and a second transparent film interposed between the first transparent film and the optical element; wherein the first transparent film is comprised of a fluorine compound so that the first transparent film is lower in refractive index than the condenser lens and the second transparent film is lower in water- and oil-repellent properties than the first transparent film.

A semiconductor substrate employed in the inventive semiconductor device is not particularly limited, but may be a substrate generally employed for forming a light receiving or emitting element therein. Examples of the substrate include semiconductor substrates such as of silicon and germanium, and compound semiconductor substrates such as of SiC, SiGe, GaAs and Al—GaAs, among which a silicon substrate is particularly preferred. The semiconductor substrate may be doped with an nor p-type impurity. The semiconductor substrate may have at least one n- or p-type well.

Examples of the light receiving or emitting element provided in the semiconductor substrate include solid image-pickup devices such as CCD image sensors, CMO image sensors, CMDs, charge injection devices, bipolar image sensors, photoconductive film image sensors, laminate CCDs and infrared image sensors, light receiving elements such as photodiodes and phototransistors, light emitting elements such as light emitting diodes, and light transmission control elements such as employed in liquid crystal panels.

The condenser lens is preferably composed of a material having a high refractive index for a higher light convergence ratio. The condenser lens may be provided, for example, by forming a silicon nitride film (having a refractive index of 2.0) by plasma CVD or forming a polyimide resin film (having a refractive index of 1.6 to 1.7) by spin coating, and shaping the film into a desired lens shape.

In the inventive semiconductor device having the intra-layer lens, the first transparent film is provided as covering the condenser lens for planarization over the condenser lens. The first transparent film preferably has a lower refractive index than that of the condenser lens. In order to allow the condenser lens to provide a desired lens effect, a difference in refractive index between the intra-layer lens and the first transparent film provided thereon should be not smaller than 0.2, preferably not smaller than 0.3.

That is, where the refractive index of the condenser lens is close to the refractive index of the first transparent film, e.g., the condenser lens and the first transparent film have the same refractive index, the function of the condenser lens is lost. Therefore, the first transparent film in the inventive semiconductor device having the intra-layer lens is preferably composed of a fluorine compound. That is, the refractive index of the first transparent film can be reduced to lower than the refractive index of the condenser lens by employing the fluorine compound for the formation of the first transparent film. A fluoroorganic compound or a fluoroinorganic compound is usable as the fluorine compound for the material of the first transparent film. Examples of the first transparent film include a magnesium fluoride film (having a refractive index of 1.3 to 1.4) formed by sputtering, and a fluorine-containing acryl resin film (having a refractive index of 1.3 to 1.5) formed by spin coating.

Where the first transparent film is composed of the fluorine organic compound having a low refractive index, however, the first transparent film has water- and oil-repellent properties and, hence, is poor in adhesion to other materials. Therefore, the second transparent film is interposed between the first transparent film and the optical element for the improvement of the adhesion therebetween in the inventive semiconductor device. The second transparent film is required to have a surface excellent in adhesion to the other materials without the water- and oil-repellent properties. Therefore, the second transparent film is preferably composed of a material containing no fluorine. For example, an acrylic resin is usable for the material of the second transparent film.

In fabrication of the inventive semiconductor device, various types of resists can uniformly be applied on the second transparent film and patterned for formation of the optical element without any inconvenience. Of course, the second transparent film has an improved adhesion to the optical element such as a micro-lens or a color filter layer formed on the second transparent film.

The second transparent film may have a higher refractive index than that of the first transparent film. Where the lens or the color filter layer is provided as the optical device, the second transparent film preferably has a refractive index intermediate between the refractive indices of the first transparent film and the optical element. Thus, the second transparent film does not influence the function of the condenser lens.

Since the second transparent film is provided on the first transparent film of the fluorine-containing material, the adhesion between the first transparent film and the second transparent film is relatively poor. However, the poor adhesion between the first transparent film and the second transparent film is less problematic than the poor adhesion between the fluorine-containing transparent film and the optical element formed thereon in the conventional semiconductor device having the intra-layer lens.

Where the optical element is provided directly on the fluorine-containing transparent film, various process steps are required in the optical element forming step. That is, any of various types of resists is applied on an optical element material layer, and patterned. In the conventional fabrication process for the semiconductor device having the intra-layer lens, a force may repeatedly be exerted on an interface between the fluorine-containing transparent film and the optical element material layer to separate the optical element material layer from the transparent film in the optical element forming step. Therefore, an adhesive strength required between the fluorine-containing transparent film and the optical element material layer is higher than that required between the first transparent film and the second transparent film.

In a second transparent film forming step according to the present invention, on the contrary, it is merely necessary to form the second transparent film on the first transparent film, and there is no need for performing various process steps as required in the optical element forming step. Therefore, the relatively poor adhesion between the first and second transparent films presents no problem.

In the present invention, the adhesion between the first transparent film and the second transparent film can be improved by performing a plasma treatment on the surface of the first transparent film in an oxygen-containing atmosphere after the formation of the first transparent film, as will be described later.

In the inventive semiconductor device, the optical element may comprise a micro-lens. Alternatively, the optical element may comprise a color filter layer in the inventive semiconductor device. Further, the optical element may comprise a color filter layer and a micro-lens provided on the color filter layer in the inventive semiconductor device.

The inventive semiconductor device may further comprise a transparent overcoat layer provided between the light receiving or emitting element and the condenser lens for planarization over the element. The overcoat layer is not particularly limited, as long as it is composed of a transparent material. For example, the overcoat layer may be a BPSG (boro-phospho silicate glass) layer formed by a reflow process.

According to another aspect of the present invention, there is provided a fabrication method for the inventive semiconductor device described above, which comprises the steps of: forming a condenser lens on a semiconductor substrate having a light receiving or emitting element; forming a first transparent film on the condenser lens for planarization over the condenser lens, the first transparent film being comprised of a fluorine compound; forming a second transparent film on the first transparent film, the second transparent film being lower in water- and oil-repellent properties than the first transparent film; and forming a light-transmittable optical element on the second transparent film.

The inventive fabrication method may further comprise the step of performing a plasma treatment in an oxygen-containing atmosphere after at least one of the first transparent film forming step and the second transparent film forming step. By performing the plasma treatment, the adhesion between the first transparent film and the second transparent film or the adhesion between the second transparent film and the optical element can further be improved. The improvement of the adhesion of the first or second transparent film is attributable to the fact that the surface of the transparent film is finely roughened by the plasma treatment in the oxygen-containing atmosphere.

With reference to FIGS. 3($a$) to 3($e$) and FIG. 4, the present invention will hereinafter be described in detail by way of an embodiment thereof. It should be understood that the invention is not limited to this embodiment, but applicable to a wide variety of devices including so-called solid image-pickup devices such as MOS-type solid image-pickup devices and devices having intra-layer lenses such as liquid crystal display devices.

Unless otherwise specified, materials and apparatuses stated in the following explanation are those generally employed in an ordinary semiconductor device fabrication process and, therefore, a detailed explanation will not be given thereto.

Figure 3A:
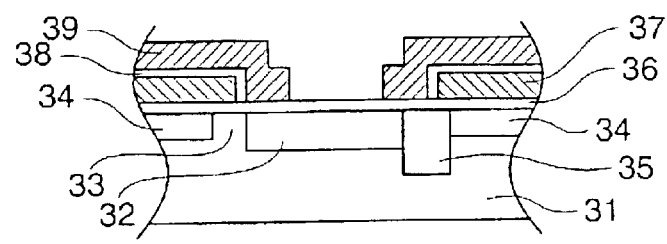
FIGS. 3(a) to 3(e) are process diagrams illustrating a production process for a solid image-pickup device according to an embodiment of the present invention.
Figure 3B:
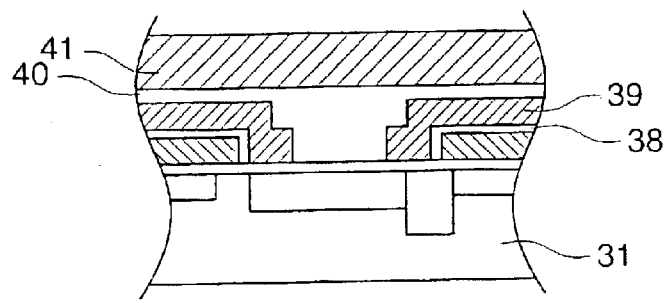
Figure 3C:
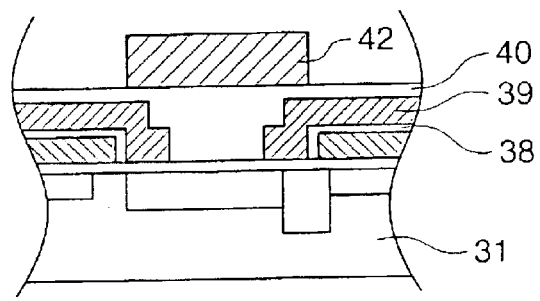
Figure 3D:
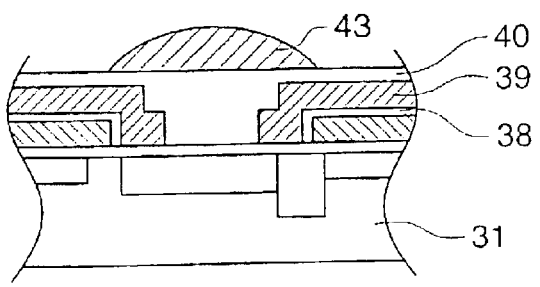
Figure 3E:
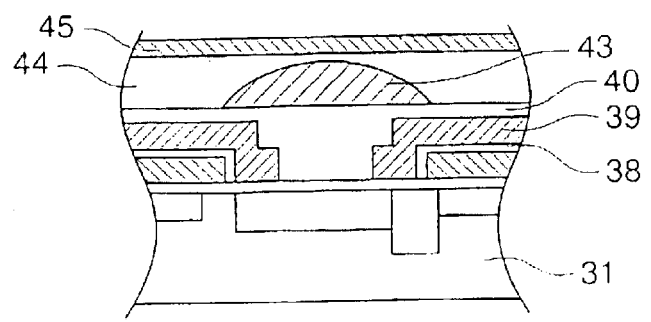
Figure 4:
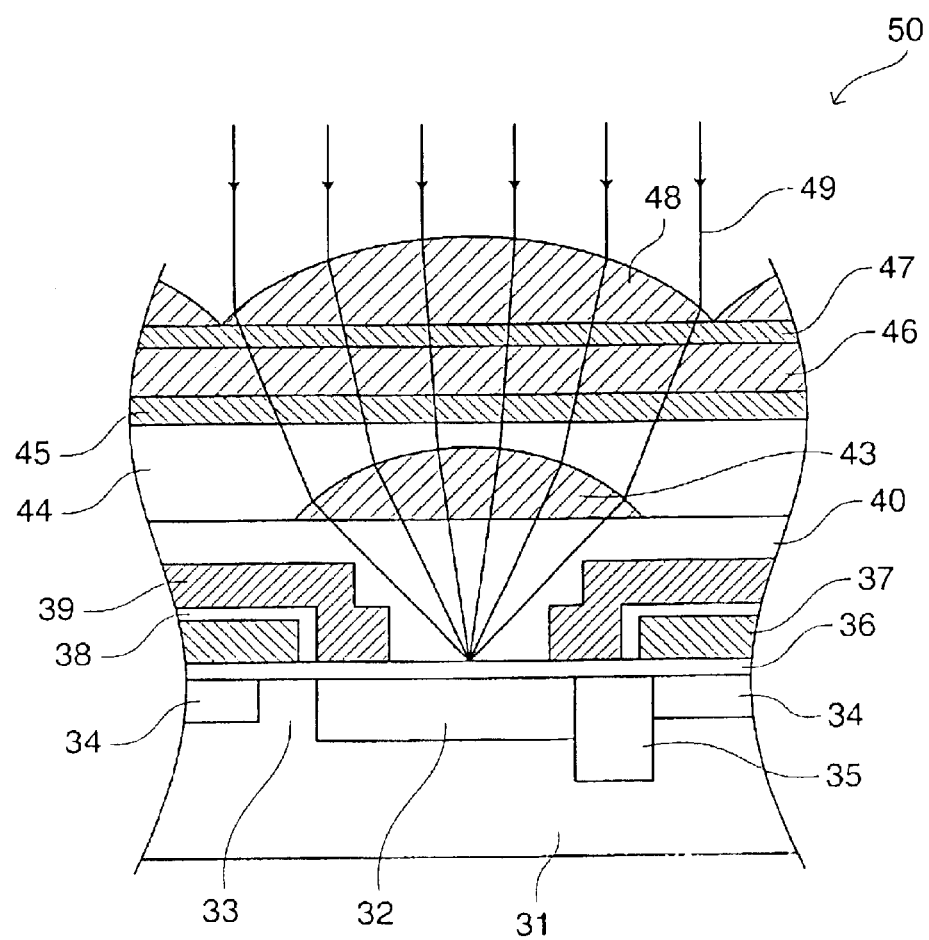
FIG. 4 is a schematic sectional view illustrating each pixel of the solid image-pickup device according to the embodiment of the present invention.

FIG. 4 is a schematic sectional view illustrating each pixel of a CCD solid image-pickup device having an intra-layer lens according to the embodiment of the present invention. FIGS. 3($a$) to 3($e$) are process diagrams illustrating a fabrication process for the CCD solid image-pickup device with the intra-layer lens shown in FIG. 4.

As shown in FIG. 4, the CCD solid image-pickup device 50 according to the embodiment of the present invention includes a semiconductor substrate 31 having a light receiving element provided therein, the light receiving element having a light receiving portion 32, an overcoat layer 40 of a transparent material provided on the light receiving portion 32 of the light receiving element, a condenser lens (intra-layer lens) 43 provided on the overcoat layer 40, a first planar transparent film 44 provided on the condenser lens 43, and a color filter 46 and a micro-lens 48 provided as optical elements above the first transparent film 44. A second transparent film 45 is interposed between the first transparent film 44 and the color filter 46 for improvement of adhesion therebetween. In FIG. 4, a reference numeral 49 denotes light rays incident on the CCD solid image-pickup device 50.

Referring to FIGS. 3($a$) to 3($e$), an explanation will hereinafter be given to a fabrication process for the CCD solid image-pickup device 50 shown in FIG. 4.

As shown in FIG. 3($a$), a light receiving portion 32, a reading gate portion 33, CCD transfer channels (transfer portions) 34 and a channel stopper 35 are formed in a semiconductor substrate 31 by implanting desired impurity ions into the semiconductor substrate 31.

Then, a silicon oxide film is formed as an insulating film 36 on the semiconductor substrate 31 by thermal oxidation, and transfer electrodes 37 having a predetermined pattern are formed on the insulating film 36. Thereafter, an inter-level insulating film 38 and a light shielding film 39 are formed on the transfer electrodes 37, and patterned so that an opening is formed therein above the light receiving portion 32. Usable as the material for the transfer electrodes 37 are polycrystalline silicon and tungsten silicide. Usable as the material for the light shielding film 39 are tungsten silicide and titanium tungsten.

As shown in FIG. 3($b$), an overcoat layer 40 is formed on the light shielding film 39 and planarized by reflowing BPSG at about 900° C. Then, a photosensitive polyimide resin 41 (e.g., PSI-P-8001 available from Chisso Corporation) is applied to a thickness of about 1.0 μm on the overcoat layer 40 by means of a spin coater, and dried on a hot plate at about 100° C. for two minutes.

As shown in FIG. 3(c), a polyimide pattern 42 is formed in a desired position by a photolithography technique commonly utilized in an ordinary semiconductor process. As shown in FIG. 3(d), the polyimide pattern 42 is heated to be reflowed at about 160° C. in a stream of nitrogen in a baking oven for about 10 minutes, and further baked at about 350° C. for one hour. Thus, a condenser lens 43 having a thickness of about 0.8 μm is provided.

As shown in FIG. 3(e), a first transparent film 44 of a transparent fluororesin (e.g., CTX-807 available from Asahi Glass Co., Ltd.) having a thickness of about 1.0 μm is formed as covering the condenser lens 43, and planarized. As required, an oxygen plasma treatment is performed at a temperature of about 80° C. at a pressure of about 50 mPa with an RF power of about 150 W for one minute for improvement of the adhesion of the surface of the first transparent film 44.

Thereafter, a second transparent film 45 of a thermosetting acryl resin (e.g., OPTOMER SS-1151 available from JSR Co., Ltd.) having a thickness of about 0.5 μm is formed on the first transparent film 44 by means of a spin coater. As required, an oxygen plasma treatment is performed at a temperature of about 100° C. at a pressure of about 40 mPa with an RF power of about 200 W for one minute for improvement of the adhesion of the surface of the second transparent film 45.

Subsequently, negative resists respectively containing pigments having green, red and blue spectral characteristics are applied on the second transparent film 45, and exposed and developed into a desired pattern for formation of a color filter 46. Then, an acryl resin (e.g., OPTOMER SS-1151 as described above) is applied to a thickness of about 0.7 μm for formation of a protective film 47. Thereafter, a micro-lens 48 is formed on the protective film 47 by a known technique (see, for example, Japanese Unexamined Patent Publication No. HEI4-12568 (1992)). Thus, the CCD solid image-pickup device 50 shown in FIG. 4 is completed.

It is confirmed that the CCD solid image-pickup device 50 fabricated in the aforesaid manner provides a photosensitivity improved 2.5 times by the light converging effect of the micro-lens 48 and the condenser lens 43.

Although the embodiment described above is directed to the CCD solid image-pickup device, the present invention is applicable to any other solid image-pickup devices such as MOS-type solid image-pickup devices and light transmission control devices such as liquid crystal display devices.

A semiconductor device having a desired configuration can be provided by properly selecting conditions for formation of the respective components, e.g., the thickness of the condenser lens, the thicknesses of the first and second transparent films, the thickness of the protective film and the thickness of the micro-lens. That is, the present invention is not limited to the semiconductor device and the fabrication method therefor according to the embodiment described above, but may be embodied in any other ways without departing from the scope of the present invention.

According to the present invention, the second transparent film having the lower water- and oil-repellent properties than that of the first transparent film is interposed between the first transparent film and the optical element, so that the optical element can be combined with the first transparent film with improved adhesion.

What is claimed is:

1. A semiconductor device comprising: a semiconductor substrate having a light receiving or emitting element; a condenser lens provided above the element; a first transparent film provided on the condenser lens for planarization over the condenser lens; a light-transmittable optical element provided above the first transparent film; and a second transparent film interposed between the first transparent film and the optical element; wherein the first transparent film is comprised of a fluorine compound so that the first transparent film is lower in refractive index than the condenser lens and the second transparent film is lower in water- and oil-repellent properties than the first transparent film.

2. A semiconductor device as set forth in claim 1, wherein the second transparent film is comprised of an acrylic resin and the first transparent film is comprised of a fluoroorganic compound.

3. A semiconductor device as set forth in claim 1, wherein the second transparent film is comprised of an acrylic resin and the first transparent film is composed of a fluoroinorganic compound.

4. A semiconductor device as set forth in claim 1, wherein the second transparent film has a higher refractive index than that of the first transparent film.

5. A semiconductor device as set forth in claim 1, wherein the optical element comprises a micro-lens.

6. A semiconductor device as set forth in claim 1, wherein the optical element comprises a color filter layer.

7. A semiconductor device as set forth in claim 1, wherein the optical element comprises a color filter layer and a micro-lens provided on the color filter layer.

8. A semiconductor device as set forth in claim 1, further comprising a transparent overcoat layer provided between the light receiving or emitting element and the condenser lens for planarization over the element.

9. A fabrication method for a semiconductor device as recited in claim 1, comprising the steps of: forming a condenser lens on a semiconductor substrate having a light receiving or emitting element; forming a first transparent film on the condenser lens for planarization over the condenser lens, the first transparent film being comprised of a fluorine compound; forming a second transparent film on the first transparent film, the second transparent film being lower in water- and oil-repellent properties than the first transparent film; and forming a light-transmittable optical element on the second transparent film.

10. A fabrication method as set forth in claim 9, further comprising the step of performing a plasma treatment in an oxygen-containing atmosphere after at least one of the first transparent film forming step and the second transparent film forming step.

* * * * *